United States Patent
Gossmann et al.

(10) Patent No.: US 6,632,728 B2
(45) Date of Patent: Oct. 14, 2003

(54) INCREASING THE ELECTRICAL ACTIVATION OF ION-IMPLANTED DOPANTS

(75) Inventors: Hans-Joachim Ludwig Gossmann, Summit, NJ (US); Conor Stefan Rafferty, New York City, NY (US); Tony E. Haynes, Knoxville, TN (US); Ramki Kalyanaraman, University City, MO (US); Vincent C. Venezia, Leuven (BE); Maria Lourdes Pelaz-Montes, Valladolid (ES)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/906,211

(22) Filed: Jul. 16, 2001

(65) Prior Publication Data

US 2003/0013260 A1 Jan. 16, 2003

(51) Int. Cl.$^7$ .............................................. H01L 21/265
(52) U.S. Cl. ..................... 438/527; 538/528; 538/530
(58) Field of Search .............................. 438/510, 514, 438/517, 527, 528, 530

(56) References Cited

U.S. PATENT DOCUMENTS

| 4,332,627 | A |   | 6/1982 | Schmitt et al. ............... 148/1.5 |
| 4,689,667 | A |   | 8/1987 | Aronowitz ..................... 357/63 |
| 5,585,286 | A | * | 12/1996 | Aronowitz et al. .......... 438/528 |

(List continued on next page.)

FOREIGN PATENT DOCUMENTS

| JP | 1233759 | 9/1989 | ............ H01L/27/10 |
| JP | 4225520 | 8/1992 | ......... H01L/21/265 |
| JP | 8181085 | 7/1996 | ......... H01L/21/265 |

OTHER PUBLICATIONS

Venezia et al., *Mechanism for the reduction . . .*, Appl. Phys. Lett., vol. 74, No. 9, pp. 1299–1301 (Mar. 1999).
Jin et al., *Vacancy Enhanced Boron . . .*, MRS Symp. Proc., Paper B5.6, pp. 1–6, San Francisco, CA. Talk given on Apr. 26, 2000.
Larsen et al., *The damage recovery and electrical activation . . .*, Nuclear Instruments and Methods in Physics Research B, vol. 112, pp. 139–143 (1996).
Saito, *Defect reduction by MeV ion implantation . . .*, Appl. Phys. Lett., vol. 63, No. 2, pp. 197–199 (Jul. 1993).
Pelaz et al., *B diffusion and clustering . . .*, Appl. Phys. Lett., vol. 70, No. 17, pp. 2285–2287 (Apr. 1997).

Primary Examiner—Savitri Mulpuri
(74) Attorney, Agent, or Firm—Michael J. Urbano

(57) ABSTRACT

We have found that under certain prescribed conditions a co-implantation process can be effective in increasing the electrical activation of implanted dopant ions. In accordance with one aspect of our invention, a method of making a semiconductor device includes the steps of providing a single crystal semiconductor body, implanting vacancy-generating, ions into a preselected region of the body, implanting dopant ions into the preselected region, the dopant implant forming interstitial defects in the body, and annealing the body to electrically activate the dopant ions. Importantly, in our method the vacancy-generating implant introduces vacancy defects into the preselected region that are effective to annihilate the interstitial defects. In addition, process steps that amorphize the surface of the implanted region are avoided, and the dose of the vacancy-generating implant is made to be greater than that of the dopant implant. In a preferred embodiment, the peak of the vacancy defect concentration profile substantially overlaps the peak of the dopant implant concentration profile. In another preferred embodiment the peak of the vacancy-generating implant profile is deeper than that of the dopant profile. In accordance with another aspect of our invention, after ion implantation is complete, only low temperature process steps (e.g., steps performed at temperatures no greater than about 800° C. for Si devices) are performed.

10 Claims, 2 Drawing Sheets

U.S. PATENT DOCUMENTS

| | | | | |
|---|---|---|---|---|
| 5,654,210 A | * | 8/1997 | Aronowitz et al. | 438/526 |
| 5,837,597 A | * | 11/1998 | Saito | 438/528 |
| 5,858,864 A | * | 1/1999 | Aronowitz et al. | 438/528 |
| 6,037,640 A | | 3/2000 | Lee | 257/408 |
| 6,063,682 A | * | 5/2000 | Sultan et al. | 438/305 |
| 6,074,937 A | * | 6/2000 | Pramanick et al. | 438/528 |
| 6,087,209 A | | 7/2000 | Yeap et al. | 438/197 |
| 6,200,883 B1 | * | 3/2001 | Aylor et al. | 438/514 |

* cited by examiner

INCREASING THE ELECTRICAL ACTIVATION OF ION-IMPLANTED DOPANTS

GOVERNMENT CONTRACTS

This invention was made with Government support under Cooperative Research and Development Agreement No. ORNL98-0499. The Government has certain rights in this invention.

FIELD OF THE INVENTION

This invention relates generally to methods of doping semiconductor devices and, more particularly, to methods for increasing the electrical activation of dopants in semiconductor (e.g., silicon) devices.

BACKGROUND OF THE INVENTION

Integrated circuits (ICs) commonly include semiconductor devices such as field effect transistors (FETs) or bipolar junction transistors (BJTs), which have junctions formed by introducing impurities (i.e., dopants) into a semiconductor body (e.g., a substrate or an epitaxial layer). The dopants are used to form particular regions of the device (e.g. the source and the drain of an FET or the emitter of a BJT).

Ion implantation is a commonly used method for introducing dopants in a controllable, reproducible fashion that is free of most undesirable side effects. During ion implantation, dopant atoms are ionized, accelerated, and directed at the semiconductor body. Illustratively the body is a single crystal silicon (Si) substrate. However, other substrate materials, such as Group. III-V compounds, are also suitable, but for simplicity we continue this exposition assuming the substrate material is Si. The dopant atoms enter the crystal lattice of the substrate, collide with Si atoms, gradually lose energy, and finally come to rest at some depth within the crystal lattice. The average depth is controlled by adjusting the acceleration energy. The dopant dose is controlled by monitoring the ion current during implantation.

One consequence of ion implantation is that defects, produced when dopant ions collide with substrate atoms, are introduced into the crystal lattice. Post-implant thermal treatments of the implanted wafer are commonly required to repair, or anneal, the lattice damage. These treatments also place dopants ions on substitutional sites within the Si substrate where the expectation is that they will be electrically active. However, because the implantation process often introduces a concentration of dopant atoms that is higher than the solubility limit, dopant atoms can precipitate out of the lattice and become electrically inactive. In addition, even below the solubility limit the damage from the implantation process can lead to segregation and/or clustering of dopant atoms. These clusters or agglomerates are immobile and electrically inactive.

A model that explains clustering and deactivation for the case of doping by boron (B) atoms in single crystal Si substrates has been presented by L. Pelaz et al., *Appl. Phys. Lett.*, Vol. 70, No. 17, pp. 2285–2287 (1997), which is incorporated herein by reference. According to this model, during implantation and prior to post-implant annealing, implanted B atoms form B-interstitial complexes in the presence of a high-concentration of Si interstitials. During annealing these complexes evolve into higher-order clusters containing several B atoms per Si interstitial. The B atoms contained in these clusters are immobile and electrically inactive. According to our interpretation of this model, if the interstitials from the B implant were removed, the formation and evolution of B interstitial complexes would be suppressed, thereby increasing the electrical activation of the implanted B profile.

Recently, V. C. Venezia, et al., *Appl. Phys. Lett.*, Vol. 74, No. 9, pp. 1299–1301 (1999), have confirmed that implanting high-energy Si ions into Si substrates creates interstitial-defects near the projected ion range of the implant ($R_p$) and vacancy defects between the surface and $R_p$. They also showed that the vacancy defects created by a 2 MeV Si implant annihilated the interstitials created by a lower energy 40 keV Si implant, thereby eliminating B-enhanced diffusion and interstitial cluster formation. Accordingly, it would appear at first blush that the elimination of interstitials from a dopant implant by a high-energy Si co-implant should increase the electrical activation of the B implant after post-implant annealing. However, two reports, one by Larsen, et al., *Nuc. Inst. Meth. Phys. Res.* B, Vol. 112, pp. 139–143 (1996) and the other by S. Saito et al., *Appl. Phys. Lett.*, Vol. 63, No. 2, pp. 197–199 (1993), demonstrate that the desired increase in activation has not been realized. Both of these articles are incorporated herein by reference. Larsen et al. co-implanted higher energy Si ions into pre-amorphized Si substrates prior to a lower energy dopant implant ($BF_2$) and observed an actual reduction in the electrical activation of the dopant for rapid thermal annealing (RTA) temperatures below about 850° C. Likewise, Saito et al. co-implanted high energy Si or As ions into pre-amorphized Si substrates after a lower energy dopant implant (B) and observed essentially no change in the electrical activation of the dopant for RTA temperatures of about 1000–1100° C.

Thus, a need remains in the art for an effective technique for increasing the electrical activation of ion-implanted dopants in semiconductor bodies in general and in Si substrates in particular.

In addition, there is a need for such a technique that does not require any pre-amorphizing steps.

There is also a need for such a technique that entails only low temperature process steps (i.e., less than about 800° C. for Si) following the completion of ion implantation.

SUMMARY OF THE INVENTION

We have found that under certain prescribed conditions a co-implantation process can be effective in increasing the electrical activation of implanted dopant ions. In accordance with one aspect of our invention, a method of making a semiconductor device includes the steps of providing a single crystal semiconductor body, implanting vacancy-generating ions into a preselected region of the body, implanting dopant ions into the preselected region, the dopant implant forming interstitial defects in the body, and annealing the body to electrically activate the dopant ions. Importantly, in our method the vacancy-generating implant introduces vacancy defects into the preselected region that are effective to annihilate the interstitial defects. In addition, process steps that amorphize the surface of the implanted region are avoided, and the dose of the vacancy-generating implant is made to be greater than that of the dopant implant. In a preferred embodiment, the peak of the vacancy defect concentration profile substantially overlaps the peak of the dopant implant concentration profile. In another preferred embodiment the peak of the vacancy-generating implant profile is deeper than that of the dopant profile.

In accordance with another aspect of our invention, after ion implantation is complete only low temperature process steps (e.g., steps performed at temperatures no greater than about 800° C. for Si devices) are performed.

BRIEF DESCRIPTION OF THE DRAWING

Our invention, together with its various features and advantages, can be readily understood from the following more detailed description taken in conjunction with the accompanying drawing, in which.

Figure 1:
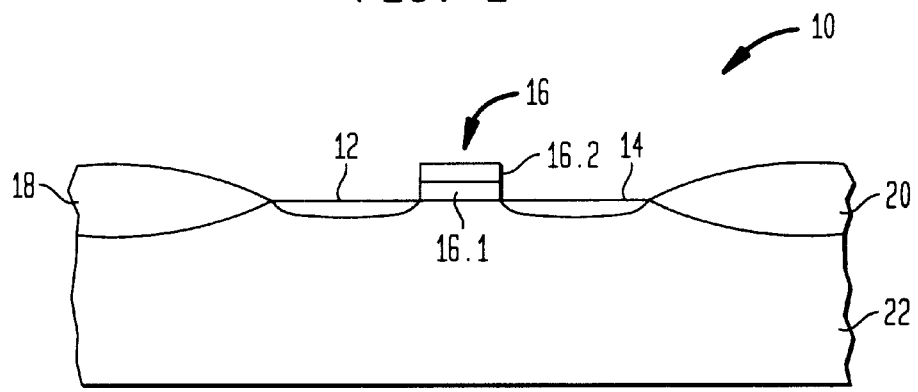
FIG. 1 is a schematic, cross-sectional view of a field effect transistor, a typical semiconductor device that can be fabricated in accordance with one embodiment of our invention.
Figure 2:
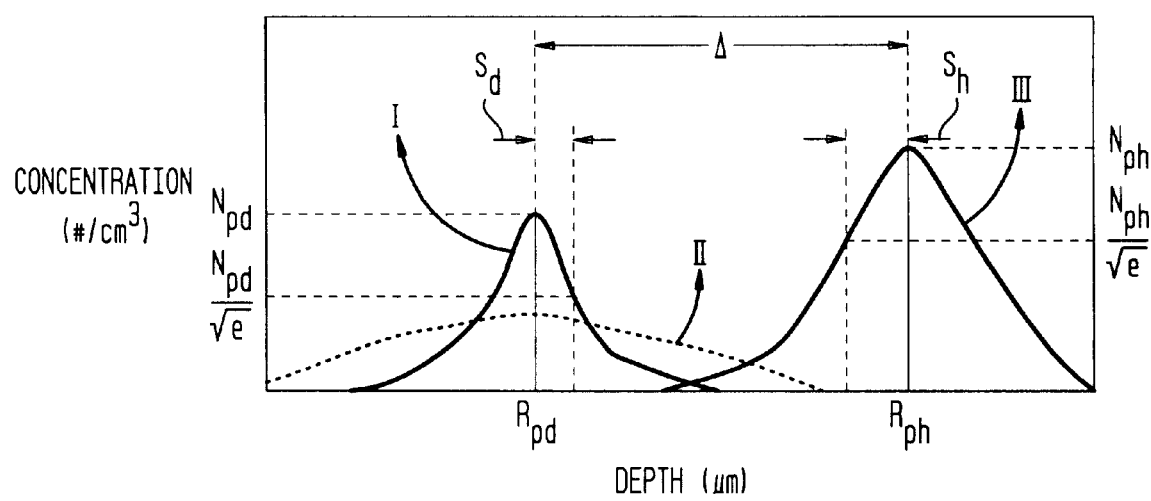
FIG. 2 is a schematic graph depicting the concentration profiles for dopant ions (Curve I), vacancies (Curve II) and vacancy-generating ions (Curve III)

In the interest of clarity and simplicity, FIGS. 1 & 2 have not been drawn to scale.

DETAILED DESCRIPTION OF THE INVENTION

General Discussion

With reference now to FIG. 1, a semiconductor device 10 includes doped regions 12 and 14 that are formed in a body 22 of single crystal semiconductor material. The device may be discrete or integrated. In the case of an IC, adjacent devices are electrically isolated from one another, in part, by oxide regions 18 and 20. In CMOS ICs further isolation is provided by means of well-known tubs (not shown). The oxide regions may be conventional field oxides (FOX) formed, for example, by the local oxidation of the semiconductor (LOCOS in the case of a Si body) or may be formed as well-known shallow trench oxides. The body 22 may be a single crystal semiconductor substrate, or such a substrate with an epitaxial layer formed thereon, or such a substrate formed on an insulator (SOI). The single crystal substrate itself is preferably Si, but may also be, for example, germanium, a mixture of germanium and silicon, or a Group III–V compound.

The device 10 may be any of a wide variety of devices that utilize ion implantation to alter the conductivity of selected regions of the device. BJTs and FETs are only two examples, but for purposes of exposition we illustrate the case of a silicon FET in FIG. 1. In this case, the body 22 is typically a single crystal Si substrate, and ion-implanted regions 12 and 14 are the source/drain regions, which are separated from one another by a gate stack 16. The gate stack, which is used to control the flow of current through a channel region (not shown) between the source and drain regions, includes an insulative layer 16.1 (i.e., the gate oxide) formed on the substrate and a conductive layer 16.2 formed on layer 16.1. For simplicity the metalization that forms electrical contacts to the source, drain and gate has been omitted, as have other ion-implanted regions (e.g., LDD, MDD, tub ties, etc.) that a typical FET might include as part of a practical IC.

The ion implantation process tends to create in the implanted regions interstitial defects that decrease the electrical activation of the implanted dopant. In addition, implantation of the dopant and high-energy non-dopant species (e.g., Si, F, As), preceded by standard pre-amorphization and standard post-implant annealing, has failed to yield any increase in activation. See, Saito et al. and Larsen, et aL, supra.

Increasing Dopant Activation

We now set forth the conditions under which co-implanting a dopant and a vacancy generating species into preselected regions of a semiconductor body is effective to increase the electrical activation of the implanted dopant in those regions. In accordance with one aspect of our invention, the electrical activation of the ion-implanted regions, which have not been pre-amorphized, is increased by implanting those regions with dopant ions that create interstitial defects therein, co-implanting the regions with vacancy-generating ions under conditions that generate vacancies that substantially annihilate the interstitial defects, and annealing the regions. More specifically, and with reference now to FIG. 2, implanting dopant ions into preselected regions of a semiconductor body produces a concentration profile depicted by Curve I, which has its peak $N_{pd}$ at a depth of $R_{pd}$, the projected end-of-range (EOR) of the implant. The spread of the dopant profile (Curve I), which is defined by a straggle parameter ($S_d$), is measured from the depth $R_{pd}$ to the depth at which the dopant concentration falls to $N_{pd}/e^{0.5}$. The implanted dopant ions produce defects, known as interstitials, in the lattice of the semiconductor body. These interstitials tend to decrease the electrical activation of the implanted dopant ions by assisting in the segregation and/or clustering of the dopants. In accordance with one aspect of our invention, the preselected region is co-implanted with a vacancy-generating species, resulting in a deeper concentration profile (Curve III) having a peak concentration of $N_{ph}$ at a depth of $R_{ph}$, its projected EOR, and also resulting in a shallower vacancy concentration profile depicted by Curve II. The spread of the vacancy-generating ion profile (Curve III), which is defined by a straggle parameter ($S_h$), is measured from the depth $R_{ph}$ to the depth at which the species concentration falls to $N_{ph}/e^{0.5}$. To this end, we prefer that the dose of the vacancy-generating implant should be sufficient to generate more vacancies than the number of implanted dopant ions. In general, the dose of the vacancy-generating ions should exceed that of the dopant implant, but the required dose of the vacancy-generating species decreases with increasing mass of the species. For example, in Si bodies we have experimentally observed the excess vacancy concentration as a function of the mass (AMU) of implanted B, Si and Ge ions. From this data we made a linear extrapolation that about 0.0027 excess vacancies are generated per AMU in general; i.e., for all types of implanted ion species. For example, a B ion with a mass of 10 AMU generates about 0.027 excess vacancies. These measurements were made for implant depths of about 2 $\mu$m, which corresponds to energies of 2 MeV for Si, 1.2 MeV for B and 3.25 MeV for Ge.

The efficiency of the vacancy production process depends on how much of the energy of the vacancy-generating species is expended in dislodging substrate atoms from their lattice sites and the relative masses of the substrate atoms and the vacancy-generating species. The initial energy of the vacancy-generating species is distributed between electronic energy loss, which does not dislodge substrate atoms, and nuclear energy loss, which does dislodge substrate atoms. In general, the number of excess vacancies per AMU of the implanted species decreases with decreasing mass and/or decreasing energy of the vacancy-generating species.

In another embodiment, we also prefer that the dopant profile (Curve I) substantially overlap the vacancy profile (i.e., Curve II). In yet another embodiment, we prefer that the peak of the vacancy-generating ion profile (Curve III) be located deeper in the implanted regions than that of the dopant profile (Curve I); i.e., $R_{ph} > R_{pd}$, which typically means that the vacancy-generating implant is a higher energy implant (e.g., of the order of 1 keV) than the dopant implant (e.g., of the order of 10 keV). To this end, we further prefer that the separation ($\Delta$) between the peaks of the two implant profiles (Curves I and III) be related to the straggle as follows:

$$\Delta \geq S_d + S_h \quad (1)$$

where $$\Delta = R_{ph} - R_{pd} \quad (2)$$

In addition, there is some flexibility in the order of some of the steps described above. For example, the dopant implant and the vacancy-generating implant make take place in any order, but best results are obtained when the dopant implant is done first. But, the annealing step is preferably performed after both implants have been completed, contrary to typical prior art processes that tend to anneal after each implant. In addition, we prefer a low temperature anneal; e.g., one that takes place at about 800° C. or less.

In general, the vacancy-generating species may be a dopant or a non-dopant. By a non-dopant we mean atoms/ions which, upon incorporation into the implanted region following an anneal, do not significantly affect the electrical conductivity of the material in that region. In those embodiments of the present invention wherein the substrate (and hence the implanted region) is Si or silicon-germanium (SiGe), it is advantageous that non-dopants such as Si or Ge atoms be used as the vacancy-generating species. However, other non-dopants such as argon and neon are also suitable. In addition, dopant atoms can also be implanted at high-energies to create the desired region of vacancy defects. This case may be desirable if other advantages can be gained from the electrical or chemical effects introduced by these dopant atoms. In general, the efficiency of the vacancy-generating step is increased as the mass of the implanted species in increased.

As noted above, the surface of the region being ion implanted should not be pre-amorphized, contrary to many prior art procedures (especially low temperature processes). Thus, in cases were the dose of the vacancy-generating implant (e.g., the high-energy implant) is otherwise sufficient to amorphize the surface, the substrate temperature should be maintained slightly above room temperature during implantation; higher mass vacancy-generating species tend to require higher substrate temperatures. Elevated temperature implantation suppresses amorphization via dynamic annealing. For example, we have found that a substrate temperature of about 65° C. is suitable for either B or Si implantation into Si bodies, whereas about 150° C. is suitable for Ge implantation. Although pre-amorphizing a region prior to dopant implantation increases the electrical activation of dopant ions implanted into Si after low temperature annealing, our invention is advantageous over processes that rely on amorphization in situations in which amorphization is otherwise undesirable. There are at least two examples where pre-amorphization is highly disadvantageous. The first case relates to doping a surface Si layer of a silicon-on-insulator (SOI) body. In this case, pre-amorphizing the surface Si layer results in non-epitaxial regrowth; i.e., polysilicon rather than single crystal Si. The implantation of high-energy ions through the Si surface layer of an SOI body deposits vacancy defects in this layer, and these vacancies remove (i.e., annihilate) interstitials created by a dopant implant during annealing. Accordingly, we would expect higher activation in the SOI surface layer. This expectation is supported by our observations of enhanced activation of B produced by vacancy-generating implants of Si into FZ Si substrates and into epitaxial Si. The second case where pre-amorphization is highly disadvantageous relates to the use of a SiGe layer in the active area of an FET in order to enhance the mobility of charge carriers in the channel region. In this case, amorphization will destroy the strain produced by the SiGe layer, hence nullifying the effect of enhanced mobility due to the strain.

We have estimated suitable ranges for energy and dose of the vacancy-generating species, the substrate temperature during implantation, as well as the annealing time and temperature, by taking into account various conditions and parameters (e.g., the energy needed to displace substrate atoms; the energy transfer from implanted ions to substrate atoms; ion and atom masses; practical limits; and our understanding of how interstitials interact with the vacancy-generating species). Our estimates then are as follows: energy of the vacancy-generating species (~12 keV–25 MeV); dose of the vacancy-generating species (~$1 \times 10^{12}$ cm$^{-2}$–$1 \times 10^{17}$ cm$^{-2}$); substrate temperature (above room temperature; e.g., 60–250° C.); annealing temperature (~400–1000° C., although an upper limit of about 800 C. is preferred for low temperature processing); and annealing time (~10 sec–1 hr., with shorter times being used with higher annealing temperatures, and conversely).

EXAMPLE

This example describes a process in accordance with one embodiment of our invention for increasing the electrical activation of B implanted into Si bodies. Various materials, dimensions and operating conditions are provided by way of illustration only and, unless otherwise expressly stated, are not intended to limit the scope of the invention.

The Si bodies, obtained from commercial sources, were of two types: (1) for the data of FIG. 3, the bodies were single-crystal Si substrates with an epitaxial layer grown thereon; the layer was doped n-type with As to a resistivity of about 0.9 ohm-cm and had a thickness greater than about 3 $\mu$m; and (2) for the data of FIG. 4, the bodies were single crystal FZ Si substrates doped p-type with B to a resistivity of about 65–80 ohm-cm. The substrate surface was not pre-amorphized. Some substrates were subjected to only a single implant of about 40 keV B ions to a dose of about $2 \times 10^{14}$ cm$^{-2}$ followed by annealing for about 1 hr at temperatures ranging from about 400° C. to 800° C. Other substrates were subjected to two implants in accordance with our invention, having been first implanted with about 2 MeV Si ions to a higher dose of about $10^{16}$ cm$^{-2}$ at a substrate temperature of about 60° C. and then implanted with about 40 keV B ions to a dose of about $2 \times 10^{14}$ cm$^{-2}$. These co-implanted substrates were also annealed for about 1 hr at temperatures ranging from about 400° C. to 800° C.

Figure 3:
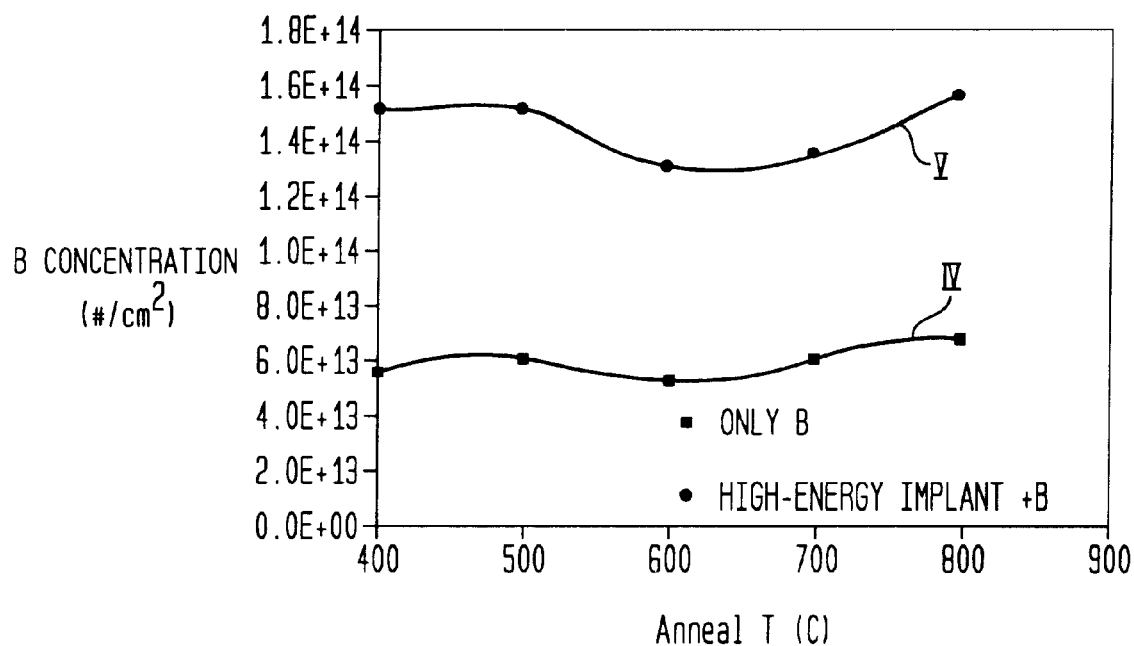
FIG. 3 is a graph showing the variation in active B concentration as a function of anneal temperature for the case of a single implant of B only (Curve IV) and for the case of co-implants of B and Si (Curve V) in accordance with one embodiment of our invention. The implanted body was a single-crystal Si substrate with an n-type epitaxial layer grown thereon.

The integrated active B concentration as a function of annealing temperature is shown in FIG. 3, where Curve IV represents data for Si epitaxial layers (epi) implanted with low energy B only, and Curve V represents data for Si epi co-implanted with low energy B and higher energy Si. This figure demonstrates the efficacy of our inventive process for increasing the electrical activation of the implanted B. More specifically, Curve V shows that the active B concentration ranged from about $1.3-1.5 \times 10^{14}$ cm$^{-2}$ for epi co-implanted in accordance with our invention, whereas the corresponding active B concentration ranged from about $5-6 \times 10^{13}$ cm$^{-2}$ for epi implanted with only B. Thus, a higher active B concentration (~2.5×higher) was achieved by implanting high-energy Si ions prior to low energy B ions and then annealing. Significantly, Curve V also demonstrates that this very substantial increase in activation is achieved even at the low end (400° C.) of the annealing range, a characteristic that makes our invention compatible with low temperature processing of semiconductor devices (e.g., ICs).

Figure 4:
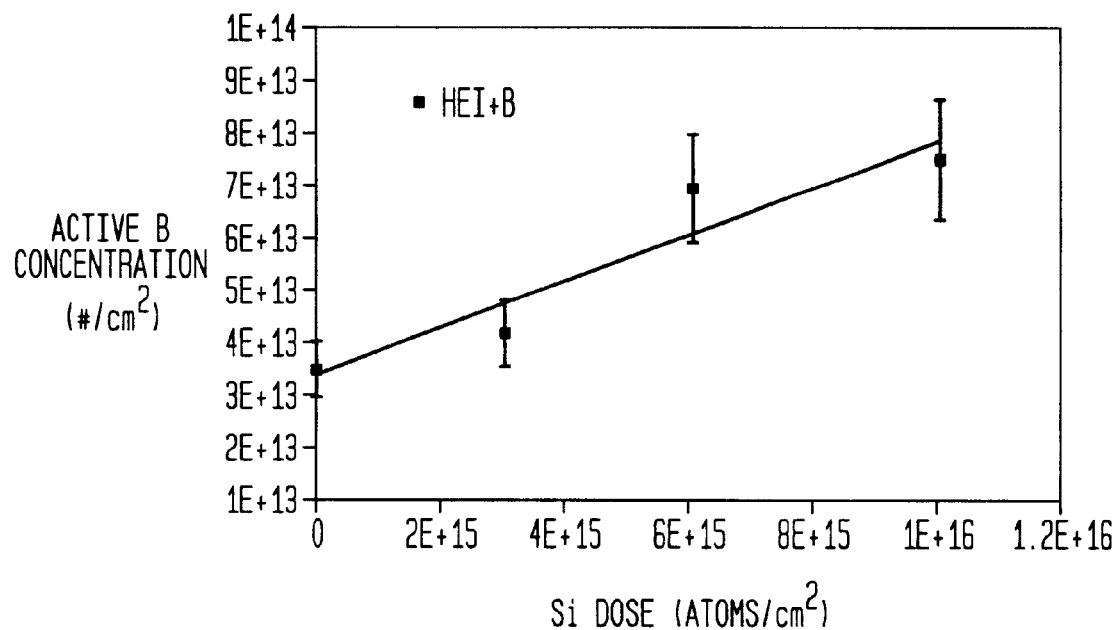
FIG. 4 is a graph showing the dependence of B activation on the dose of a Si co-implant with a post-implant anneal at 700° C. for 55 min. The implanted body was a p-type single-crystal FZ Si substrate.

In addition, FIG. 4 demonstrates the dependence of B activation on the dose of the Si implant. The active B concentration increased essentially linearly from about $3.5 \times 10^{13}$ cm$^{-2}$ for the case of no Si co-implant to about $7.5 \times 10^{13}$ cm$^{-2}$ for a Si co-implant at a dose of about $1 \times 10^{16}$ cm$^{-2}$. The energy and dose of the B implant was about 40 keV and $2 \times 10^{4}$ cm$^{-2}$, respectively. Possible reasons that the maximum activation in this case was lower are the different dopant type (n-type vs. p-type) and the impurity (i.e., oxygen and carbon) content of the implanted body, which was a p-type FZ Si substrate rather than an n-type Si epitaxial layer.

It is to be understood that the above-described arrangements are merely illustrative of the many possible specific embodiments that can be devised to represent application of the principles of the invention. Numerous and varied other arrangements can be devised in accordance with these principles by those skilled in the art without departing from the spirit and scope of the invention.

What is claimed is:

1. A method of making a semiconductor device comprising the steps of:
   providing a single crystal semiconductor body,
   implanting dopant ions into a pre-selected single crystal region of said body, said dopant ions forming interstitial defects in said region after said body is annealed,
   annealing said body to electrically activate said dopant ions, characterized in that
   prior to said annealing step, performing the following steps:
   avoiding any process steps that would amorphize said region,
   implanting vacancy-generating ions into said single crystal region, thereby to create vacancies that substantially annihilate said interstitial defects, and
   maintaining the implantation dose of said vacancy generating ions to be greater than that of said dopant ions,
   the distribution of said dopant ions in said region and the distribution of said vacancy-generating ions in said region being separated from another so that the peak of said vacancy-generating ion distribution is deeper in said region than the peak of said dopant distribution,
   said vacancy-implanting step and said dose-maintaining step being mutually adapted to increase the activation of said dopant ions.

2. The invention of claim 1 wherein the distribution of said dopant ions in said region and the distribution of said vacancies in said region substantially overlap one another.

3. The invention of claim 1 wherein the spread of said dopant and vacancy-generating ion distributions are characterized by straggle parameters $S_d$ and $S_h$, respectively, and wherein the peaks of said distributions are separated from one another by a distance $\Delta$ such that $\Delta \geq S_d + S_h$.

4. The invention of claim 1 wherein said vacancy-generating ion implant is performed at a higher energy than said dopant ion implant.

5. The invention of claim 1 wherein said region is selected from the group consisting of single crystal silicon and SOI, and said vacancy generating implant is performed at an energy of the order of 1 MeV and said dopant ion implant is performed at an energy of the order of 10 keV.

6. The invention of claim 1 wherein said body comprises silicon and is annealed at a temperature in the range of about 400–800° C.

7. The invention of claim 1 wherein said vacancy-generating implant is performed at a temperature above room temperature.

8. The invention of claim 1 wherein said vacancy-generating implant is performed before said dopant implant.

9. The invention of claim 1 wherein, after all implanting steps are completed, no step is performed at a temperature in excess of about 800° C.

10. A method of making an IC comprising the steps of:
    providing a single crystal silicon body,
    implanting boron dopant ions into a pre-selected single crystal region of said body, said dopant ions forming interstitial defects in said region after said body is annealed,
    annealing said body to electrically activate said dopant ions, characterized in that
    prior to said annealing step, performing the following steps
    prior to implanting said boron ions, implanting vacancy-generating silicon ions into said single crystal region, thereby to create vacancies that substantially annihilate said interstitial defects,
    maintaining the implantation dose and energy of said vacancy generating ions to be greater than that of said dopant ions,
    implanting said ions so that the distribution of said dopant ions in said region and the distribution of said vacancies in said region substantially overlap one another,
    implanting said ions so that the distribution of said dopant ions in said region and the distribution of said vacancy-generating ions in said region are separated from one another so that peak of said vacancy-generating ion distribution is deeper in said region than the peak of said dopant ion distribution,
    the spread of said dopant and vacancy generating ion distributions being characterized by straggle parameters $S_d$ and $S_h$, respectively, and wherein the peaks of said distributions are separated from one another by a distance $\Delta$ such that $\Delta \geq S_d + S_h$,
    after all implanting steps are completed, no step is performed at a temperature in excess of about 800° C., and
    avoiding any process steps that would amorphize said region.

* * * * *